United States Patent
Wan et al.

(10) Patent No.: US 9,350,383 B2
(45) Date of Patent: *May 24, 2016

(54) RUN TOTAL ENCODED DATA PROCESSING

(71) Applicant: Pivotlink Corp., Bellevue, WA (US)

(72) Inventors: Qiang Wan, Bellevue, WA (US); James Boorn, Maple Valley, WA (US)

(73) Assignee: Pivotlink Corp., Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/674,871

(22) Filed: Nov. 12, 2012

(65) Prior Publication Data

US 2013/0073587 A1    Mar. 21, 2013

Related U.S. Application Data

(63) Continuation of application No. 11/250,787, filed on Oct. 14, 2005, now Pat. No. 8,311,994.

(51) Int. Cl.
*H03M 7/00* (2006.01)
*G06F 17/30* (2006.01)
*H03M 7/46* (2006.01)

(52) U.S. Cl.
CPC ........... *H03M 7/46* (2013.01); *G06F 17/30371* (2013.01)

(58) Field of Classification Search
CPC .......................... H03M 7/46; G06F 17/30371
USPC .......................................................... 707/693
See application file for complete search history.

(56) References Cited

U.S. PATENT DOCUMENTS

| | | | |
|---|---|---|---|
| 4,792,981 A | 12/1988 | Cahill, III et al. |
| 4,799,242 A | 1/1989 | Vermeulen |
| 5,506,580 A | 4/1996 | Whiting et al. |
| 5,532,694 A | 7/1996 | Mayers et al. |
| 5,572,206 A | 11/1996 | Miller et al. |
| 5,713,001 A | 1/1998 | Eberhard et al. |
| 6,092,092 A | 7/2000 | Felt et al. |
| 6,218,970 B1 | 4/2001 | Jaquette |
| 2006/0184719 A1 | 8/2006 | Sinclair |

OTHER PUBLICATIONS

FileFormat, Run-Length Encoding (RLE), WayBackMachine Feb. 16, 2005, pp. 1-10; (http://web.archive.org/web/20050216154948/http://www.fileformat.info/mirror/egff/ch09_03.htm).*

* cited by examiner

*Primary Examiner* — Alexey Shmatov
(74) *Attorney, Agent, or Firm* — Knobbe, Martens, Olson & Bear, LLP

(57) ABSTRACT

A system, method and data structure for processing a sequential set of data. A set of data is processed such the repetitive sequences of data are represented by a value and an offset of the last array element in the sequence. The resulting compressed array facilitates binary searching of data element values, modification of data element values, and/or addition/deletion of data array elements without requiring a regeneration of the array.

18 Claims, 8 Drawing Sheets

RUN TOTAL ENCODED DATA PROCESSING

CROSS-REFERENCE TO RELATED APPLICATION

This application is a continuation of U.S. patent application Ser. No. 11/250,787, entitled RUN TOTAL ENCODED DATA PROCESSING, and filed Oct. 14, 2005, the entirety of which is incorporated herein by reference.

FIELD OF THE INVENTION

In general, the present invention relates to computer software and data processing, and in particular, to a method, system and data structures for processing sequential data elements in an array using run total encoding.

BACKGROUND OF THE INVENTION

Generally described, various computing systems exist in which one or more computing devices generate data to be analyzed. For example, a business system may include various computing devices that obtain/generate manufacturing and sales data that can be stored. The stored data can be analyzed for reporting and trend analysis. As the complexity of the computing systems and the data generated by the computing systems increase, a computing system administrator attempt to mitigate the strain on computing system resources, such as processor load and storage capacity, by incorporating some type of compression algorithm.

For many scenarios, the type of compression algorithm used by the computing system can be influenced by various characteristics of the data being collected. In one typical example, computing systems, such as business computing systems, can often collect data in a database that includes repetitive data entries. For example, in a sales information database, a computing system may generate millions of records corresponding to sales transactions in which multiple records would have the same date identifier, store identifier, register identifier, sales rep identifier, etc. Accordingly, in such scenarios, the computing system could incorporate a compression algorithm to reduce the amount of data required to store the repetitive data.

One conventional algorithm for compressing data in repetitive data embodiments is generally referred to as run length encoding. One skilled in the relevant art will appreciate that run length encoding of a sequential array of data generally relates to a determination of repeating data values in a sequence of data elements. The original data in the array can then be represented in a compressed array in which each data entry in the compressed array includes a data value element and the number of sequential data elements in the original array that share the common value. FIG. 1 is a block diagram illustrative of sequential data array 100 represented in a run length encoded array 150 in accordance with a conventional run length encoding algorithm. As illustrated in FIG. 1, a data array can include a series of array elements 102-124 that include multiple series of repeating values. In accordance with conventional run length encoding, the first three array elements 102-106 can be represented in array 150 at array element 152 by their value "A" and the number of sequential array elements having the value, e.g., "3". Similarly, array elements 108-112 can be represented in array 150 at array element 154 by their value "B" and the number of sequential array elements having the value, e.g., "3". With continued reference to FIG. 1, array element 156 corresponds to array elements 114 and 116 and array element 158 corresponds to array elements 118-124. Thus, in the illustrative embodiment, the 12 element array 100 can be represented by a four element compressed array 150.

Although various compression algorithms can minimize the amount of data that is stored by a computing system, conventional compression algorithms typically do not facilitate efficient searching of the compressed array. For example, in a run length encoding algorithm searching for array elements can be achieved by a linear search of the compressed array or a complete regeneration of the original array. Both searching scenarios are inefficient and place greater strain on processing resources. Additionally, the conventional compression algorithms typically do not allow the computing system to manipulate array element values and add/subtract array elements without requiring a regeneration of the original array. Accordingly, conventional compression algorithm approaches are deficient in requiring array element regeneration in the computing system to analyze and/or process data contained within a compressed data array.

SUMMARY OF THE INVENTION

A system, method and data structure for processing a sequential set of data. A set of data is processed such the repetitive sequences of data elements are represented by a common value and an offset of the last array element in the sequence. The resulting compressed array facilitates binary searches of data element values, modification of data element values, and/or addition/deletion of data array elements without requiring a regeneration of the array.

In accordance with an aspect of the present invention, a method for processing data is provided. A computer system obtains a set of data defined by an offset and a value. The computer system generates an entry in a value array corresponding a value of a first data element in the set of data. Additionally, the computer system determines whether any sequential data elements in the set of data have the same value as the first data element. Based on the determination, the computer system generates an entry in an offset array corresponding to an offset of a last sequential data element having the same value as the first data element. The computer system then repeats the method for each additional data element in the set of data.

In accordance with another aspect of the present invention, a method for processing an array of data defined by an offset and a value is provided. A computer system obtains a value array including a set of values for one or more sequences of array elements in the array of data and an offset array corresponding to an offset of a last sequential data element corresponding to the one or more sequences of array elements. The computer system then obtains a request to identify information associated with an array element. The array element is defined by a positional offset in the array of data. The computer system performs a binary search of the offset array to identify an entry corresponding to the positional offset in the array of data. Based on the binary search, the computer system returns information corresponding to the binary search. The computer system can also manipulate data elements in the offset array and value array.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Generally described, the present invention relates to a system, method and data structures for processing data. More specifically, the present invention relates to the utilization of run total encoding to process an array of sequential data. The processed data can be searched using binary searching and/or manipulated without requiring a regeneration of the original array of sequential data. Although the present invention will be described with regard to specific data structures and illustrative examples, one skilled in the relevant art will appreciate that the disclosed embodiments should not be construed as limiting.

Figure 1:
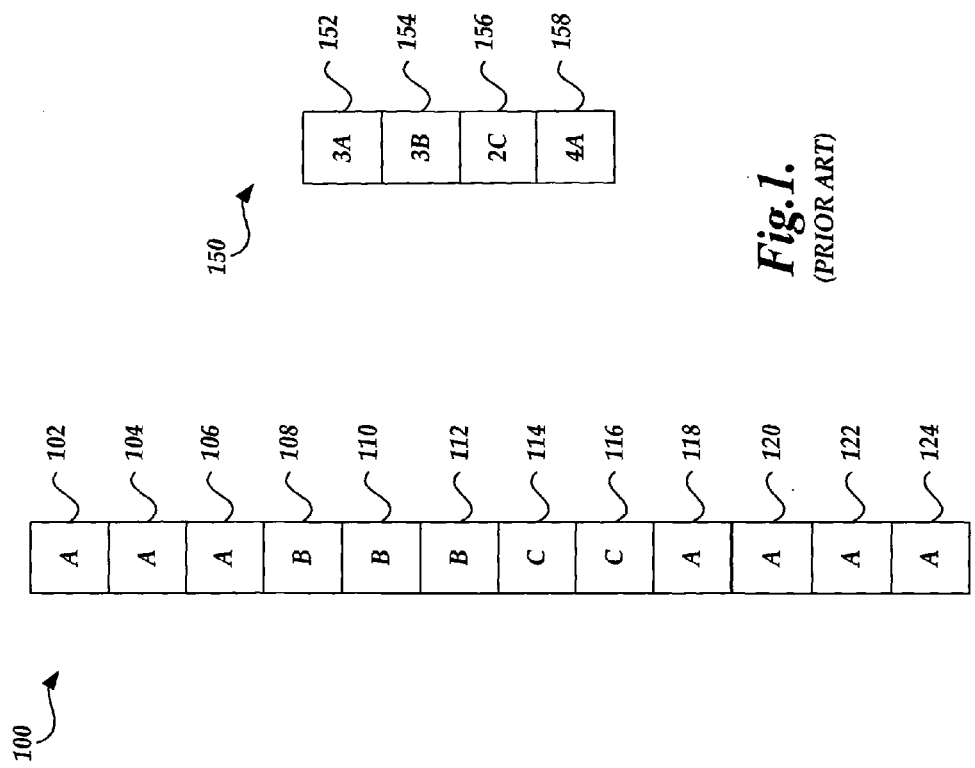
FIG. 1 is a block diagram illustrative of sequential data array represented in a run length encoded array in accordance with a conventional run length encoding algorithm.
Figure 2:
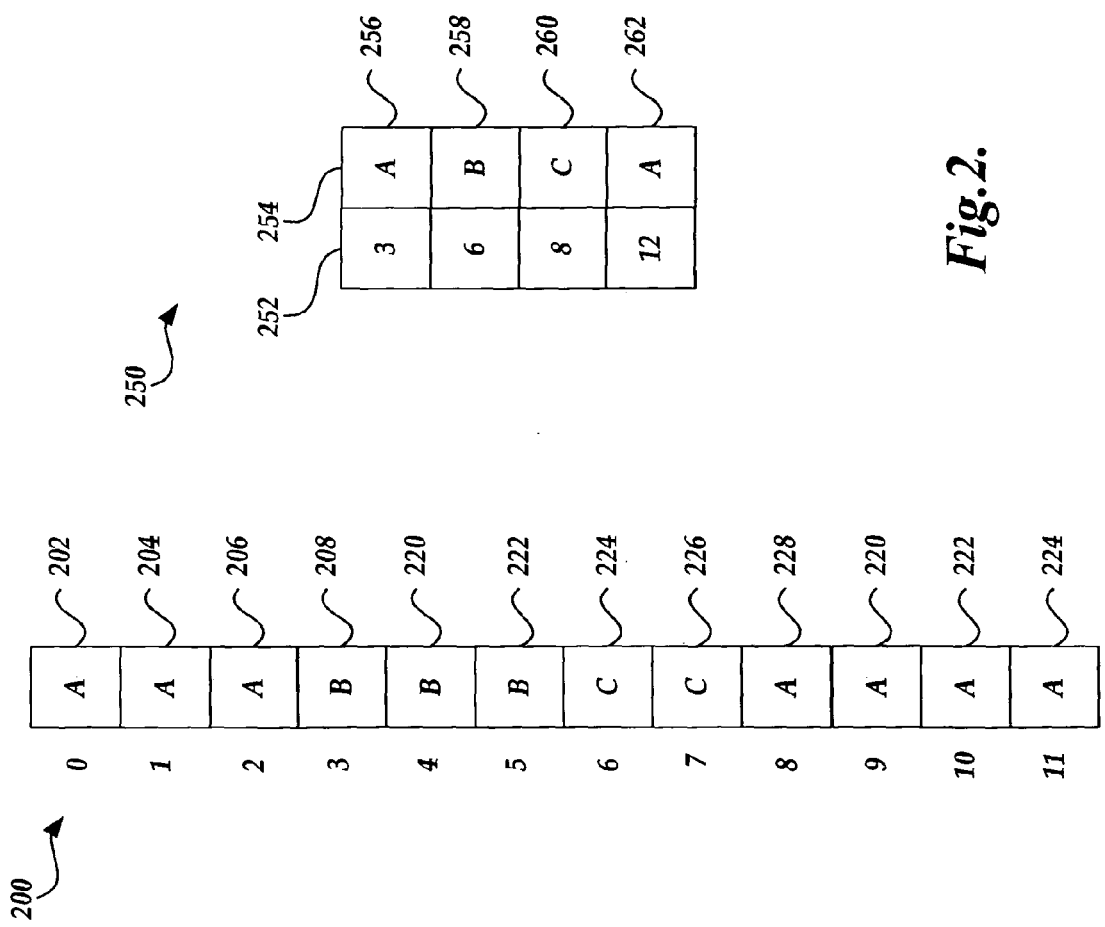
FIG. 2 is a block diagram illustrative of sequential data array represented in a run total encoding array in accordance with an aspect of the present invention.

FIG. 2 is a block diagram illustrative of sequential data array 200 represented in a run total encoding array 250 in accordance with an aspect of the present invention. For illustrative purposes, the sequential data array 200 includes a set of array elements 202-224, each having a value. As illustrated in FIG. 2, at least a portion of the array elements include repetitive sequences of data, such as sequences 202-206, 208-212, 214-216, and 218-224.

In accordance with an illustrative embodiment of the present invention, a second array 250 can be used to represent array 200. The second array 250 corresponds to a dual column array in which a first column 252 corresponds to the positional offset of a the last array element in an array sequence. In an illustrative embodiment, the positional offset value stored in the first column is the value of the offset of the next array element after the last array element. In an illustrative embodiment of the present invention, the first column 252 is generally referred to as the "RT_LIST" array. The second column 254 of array 250 corresponds to the common value of the sequence of array elements. In an illustrative embodiment of the present invention, the second column 254 is generally referred to as the "VALUE_LIST" array. The second array 250 includes an offset pointer, generally referred to as "P", to retrieve information from the array and/or modify any additional data. The second array 250 also includes a total number of array elements, generally referred to as RT_LIST size. One skilled in the art will appreciate that the labels and definitions of the columns are illustrative in nature and should not be construed as limiting.

With continued reference to FIG. 2, in accordance with an aspect of the present invention, the first sequence of common value array elements 202-206 from array 200 are represented in array 250 in offset 256. More specifically, column 252 indicates that the positional offset after the last array element in the original array 200, e.g., array element 206, is "3". In turn, column 254 indicates that the common value for the sequence is "A". In a similar manner, offset 258 of array 250 indicates that the positional offset after the last array element of the next sequence in the original array 200, e.g., array element 212, is "6" and that the common value for the sequence is "B". Offset 260 of array 250 indicates that the positional offset after the last array element of the next sequence in the original array 200, e.g., array element 216, is "8" and that the common value for the sequence is "C". Finally, offset 262 indicates that the positional offset after the last array element of the next sequence in the original array 200, e.g., array element 224, is "12" and that the common value for the sequence is "A". As will be described in greater detail below, the representation of data in an array 250 (e.g., the compression of data array 200 in array 250) facilitates the binary searching of the array 250, the modification of data values, and/or the addition/deletion of data elements without requiring a regeneration of the original data array 200.

Figure 3:
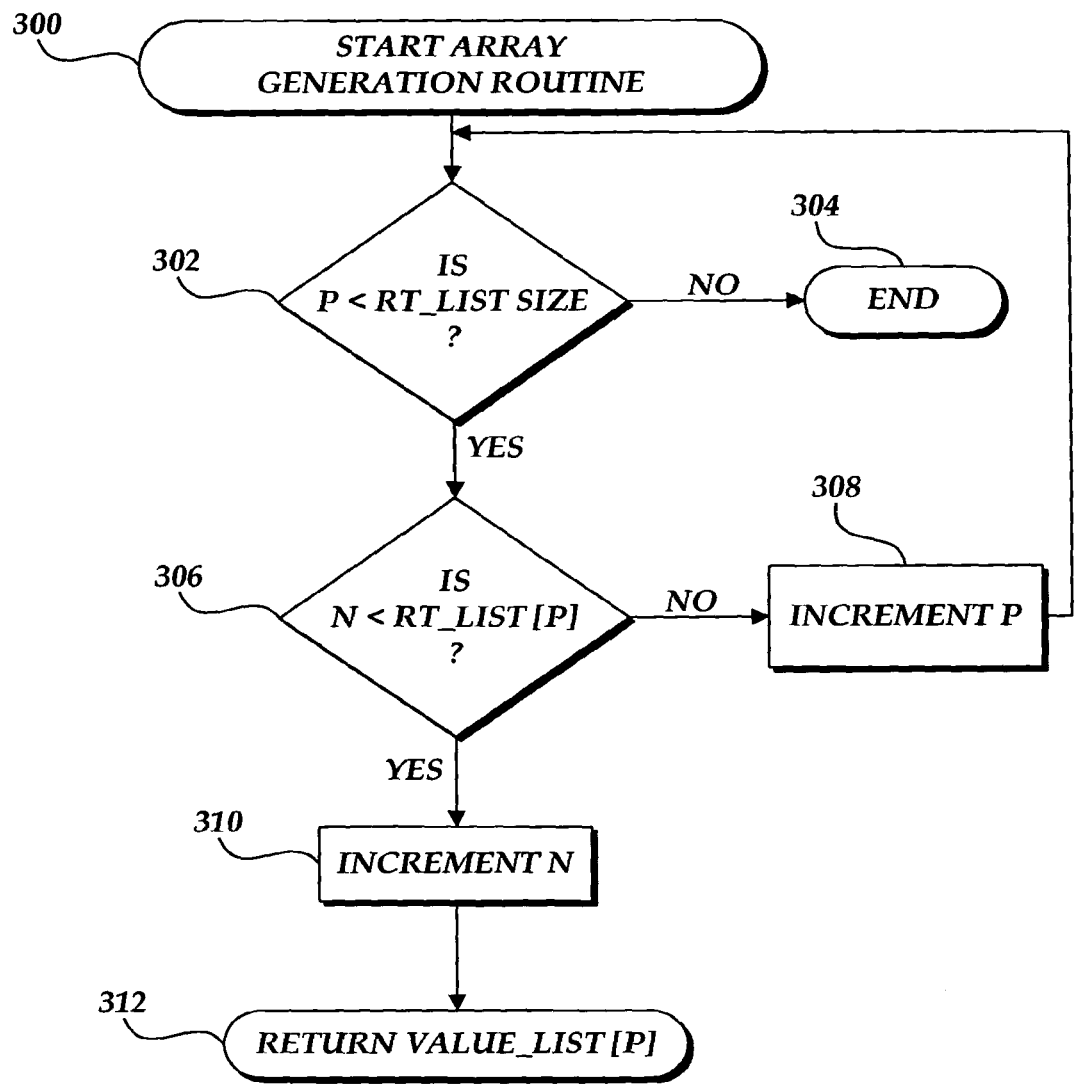
FIG. 3 is a flow diagram illustrative of an array generation routine implemented by a computing device in accordance with an aspect of the present invention.

With reference now to FIG. 3, an array generation routine 300 implemented by a computing device in accordance with an aspect of the present invention will be described. Routine 300 can be implemented by a computing system that has generated, or otherwise obtained, a compressed array, such as array 250. In this embodiment, the computing system can implement routine 300 several times to sequentially regenerate an array tracked by offset "N". At decision block 302, a test is conducted to determine whether the pointer to the offset of array 250, "P", is less than the total length of the array, "RT_LIST SIZE". If so, the end of the array 250 has been reached and routine 300 ends at block 304. If the end of the array 250 has not been reached, at decision block 306, a test is conducted to determine whether an array element offset N is not less than value of the offset in the RT_LIST at P, e.g., RT_LIST [P]. If the array element offset N is greater than the RT_LIST [P], the value of N array element will be found in the next offset of array 250. Accordingly, P is incremented at block 308 and routine 300 returns to decision block 302. Alternatively, if at decision block 306, the array element offset N is less than RT_LIST [P], the value of the array element is represented in the current offset of array 250. Accordingly, at block 310, the array element offset N is incremented to point to the next array element and the value for the array element represented at VALUE_LIST at P, e.g., VALUE_LIST [P] is returned at block 312.

Figure 4:
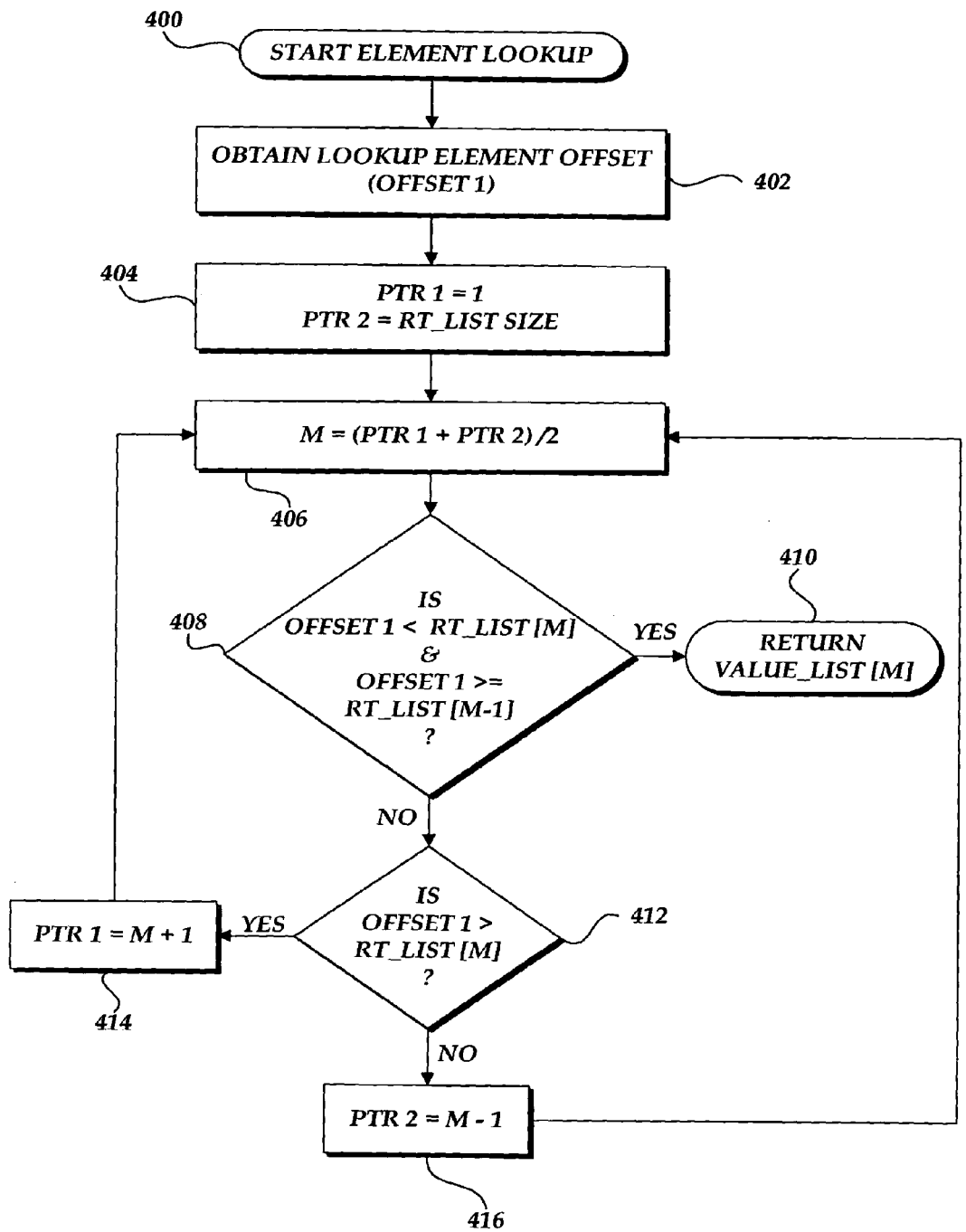
FIG. 4 is a flow diagram illustrative of an array element lookup routine implemented by a computing device in accordance with an aspect of the present invention.

With reference now to FIG. 4, a flow diagram illustrative of an array element lookup routine 400 implemented by a computing device in accordance with an aspect of the present invention will be described. Routine 400 can be implemented by a computing system that has generated, or otherwise obtained, an array 250 and is utilized to return the value of an array element represented in an original array at offset, e.g., OFFSET 1, and/or the offset value of array element in array 250. Routine 400 is also representative of a binary searching technique.

At block 402, the computing system obtains the lookup element offset, OFFSET 1, which corresponds to an offset of the element in the original array 200. At block 404, the computing device sets a first variable, "PTR 1", to a value of "1" and a second variable, "PTR 2", to a value of RT_LIST SIZE. At block 406, the computing device sets a third variable, "M", to a value of (PTR 1+PTR 2)/2. One skilled in the relevant art will appreciate that the M represents the mid point of the offset for array 250. At decision block 408, a test is conducted to determine whether the value of OFFSET 1 is less than offset value of RT_LIST [M] and less than or equal to the offset value of RT_LIST [M−1]. As described above, column 254 is populated with the positional offset after the last array element in an array sequence. Accordingly, if the value of OFFSET 1 is between the positional offset at RT_LIST [M] and the positional offset at RT_LIST[M−1], OFFSET 1 corresponds to a data array element represent in the sequence at M. If so, at block 410, the computing device returns the value of the array element as VALUE_LIST [M]. Additionally, the computing device could also return the value of M to identify the corresponding offset in the array 250.

If at decision block 408, OFFSET 1 is not between the positional offset at RT_LIST [M] and the positional offset at RT_ LIST[M−1], at decision block 412, a test is conducted to determine whether OFFSET 1 is greater than the positional offset at RT_LIST [M]. If so, at block 414, the value of PTR 1 is changed to M+1. The routine 400 returns to block 406, where the search is continued with the bottom portion of the array 250. If the value of OFFSET 1 is not greater than the positional offset at RT_LIST [M], at block 416, the value of PTR 2 is changed to M−1. The routine 400 returns to block 406, where the search is continued with the top portion of the array 250.

Figure 5:
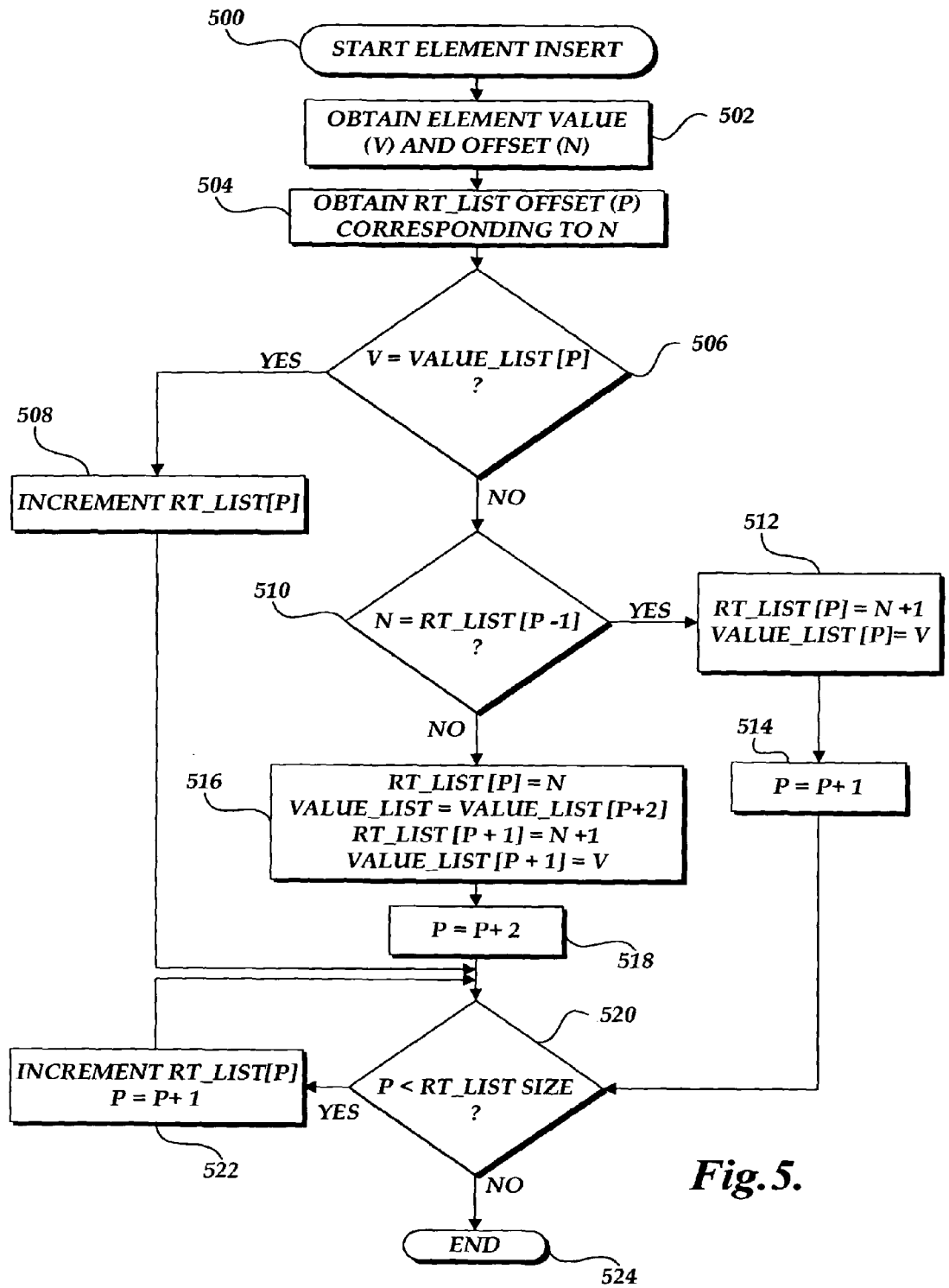
FIG. 5 is a flow diagram illustrative of an array element insertion routine implemented by a computing device in accordance with an aspect of the present invention.

With reference now to FIG. 5, a flow diagram illustrative of an array element insertion routine 500 implemented by a computing device in accordance with an aspect of the present invention will be described. Routine 500 can be implemented by a computing system that has generated, or otherwise obtained, an array 250 and is utilized to insert an element in the data array 250 without requiring a regeneration of the original data array 200 and reprocessing. Additionally, routine 500 can be used generally to generate the array 250.

At block 502, the computing system obtains an element value, "V", to be added and a positional offset, "N", where to insert the element value in original array. The information may be passed to the computing device or otherwise extracted from the original array 200. At block 504, the computing device obtains the positional offset of the array 250, "P", corresponding to N. In an illustrative embodiment of the present invention, routine 400 may be utilized to return the positional offset P. At decision block 506, a test is conducted to determine whether the value of the element to be inserted is the same of the current value in the sequence, e.g., VALUE_LIST [P]. If so, the additional element can be represented by incrementing the positional offset found in column 252 at the current pointer, e.g., RT_LIST [P], at block 508. The routine 500 proceeds to decision block 520, which will be described in greater detail below.

If at decision block 560, the value of the inserted element is not the same as the value for the current element at N, at decision block 510 a test is conducted to determine whether N is equal to the positional offset found in column 252 at the previous pointer value, e.g., RT_LIST [P−1]. If N is equal to the positional offset found in column 252 at the previous pointer value than the array element is at the end of a previous sequence. Accordingly, at block 512 an extra array element is added to array 250 at P. Additionally, the offset and value of the new array element are RT_LIST [P]=N+1 and VALUE_LIST [P]=V. At block 514, the value of P is incremented and the routine 500 proceeds to decision block 520, which will be described in greater detail below.

If at decision block 510, N is not equal to the positional offset found in column 252 at the previous pointer value than the array element is in the middle of a previous sequence. Accordingly, at block 516 two extra array elements are added to array 205 at P and P+1. Additionally, the offset and value of the new array elements are RT_LIST [P]=N, VALUE_LIST [P]=VALUE_LIST [P+2], RT_LIST [P+1]=N+1 and VALUE_LIST [P+1]=V. At block 516, the value of P is incremented by 2 and the routine 500 proceeds to decision block 520.

With continued reference to FIG. 5, at decision block 520, a test is conducted to determine whether P is less than the RT_LIST SIZE of the array 250. Because an element has been added to the array 200, all the offsets after the inserted array element have been changed. Accordingly, some subsequent offsets in array 250 should also be incremented. Accordingly, if P is less than the RT_LIST SIZE, at block 522, the RT_LIST [P] is incremented and P is incremented. The routine 500 returns to decision block 520. The routine 500 will repeat this step until the end of the array 250 is reached and routine 500 ends at block 524.

Figure 6:
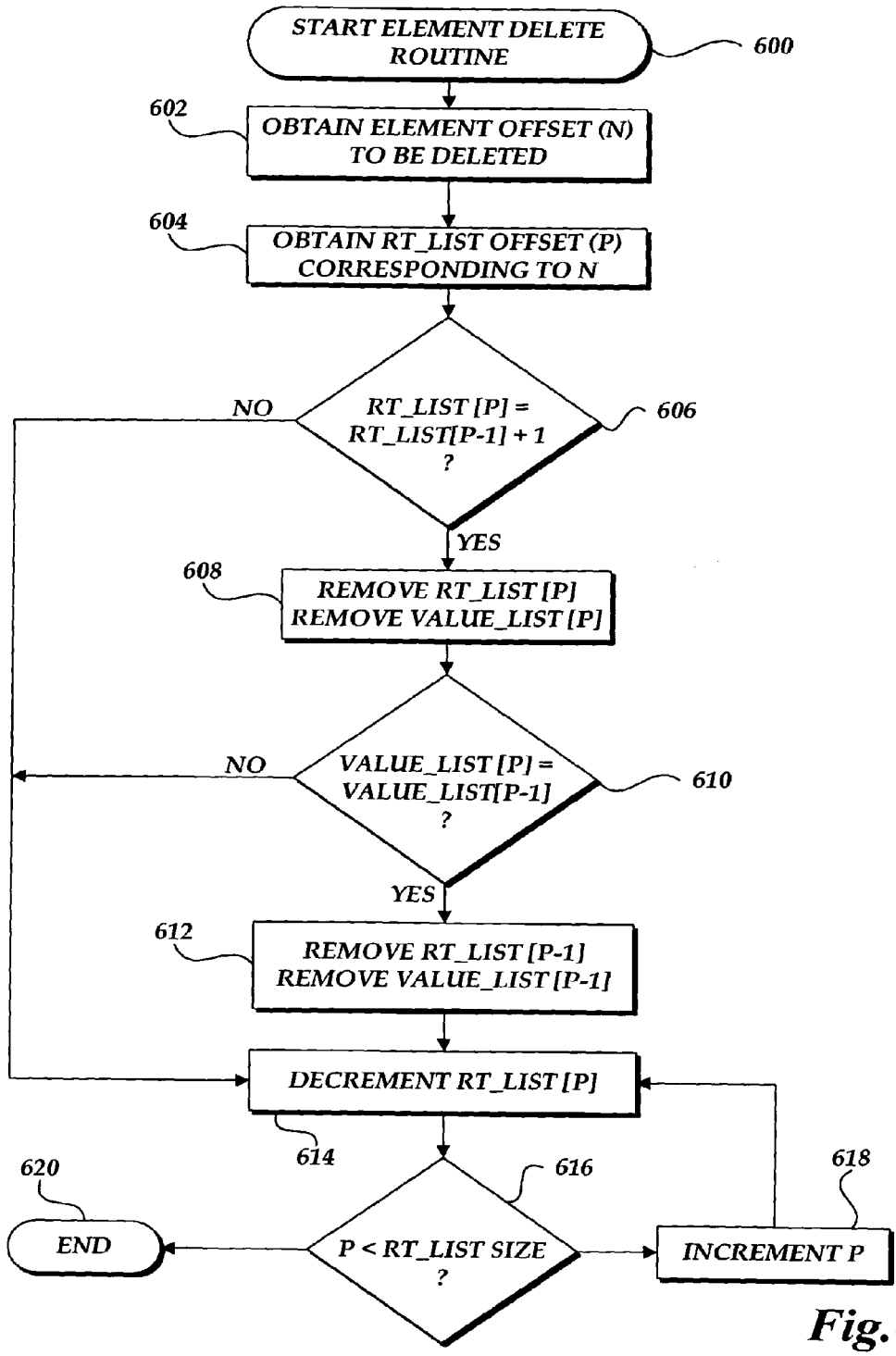
FIG. 6 is a flow diagram illustrative of an array element deletion routine implemented by a computing device in accordance with an aspect of the present invention.

Turning now to FIG. 6, a flow diagram illustrative of an array element deletion routine implemented by a computing device in accordance with an aspect of the present invention will be described. Routine 600 can be implemented by a computing system that has generated, or otherwise obtained, an array 250 and is utilized to delete an element in the data array 250 without requiring a regeneration of the original data array 200 and reprocessing.

At block 602, the computing system obtains a positional offset, "N", in the original array to be deleted. At block 604, the computing device obtains the positional offset of the array 250, "P", corresponding to N. In an illustrative embodiment of the present invention, routine 400 may be utilized to return the positional offset P. At decision block 606, a test is conducted to determine whether the identified array element N is a single array element that is not part of any sequence of array elements in array 250. In an illustrative embodiment, the computing system determines whether RT_LIST [P] is equal to the RT_LIST [P−1]+1. If the identified array element is not part of a single array element, the routine 600 proceeds to decrement the offset in RT_LIST [P] at block 614, which will be described in greater detail below. Alternatively, if the identified array element is part of a single array element, the array element is removed at block 608. More specifically, in an illustrative embodiment, the RT_LIST [P] and VALUE_LIST [P] entries are removed from array 250.

At decision block 610, a test is conducted to determine whether the two newly adjacent array elements can be collapsed. More specifically, the computing system determines whether the new value of VALUE_LIST [P] is equal to the preceding value of VALUE_LIST [P−1]. If the values are different, the routine 600 proceeds to block 614. If the values are equal, at block 612, the computing system removes the entries for VALUE_LIST [P−1] and RT_LIST [P−1].

With continued reference to FIG. 6, after decision blocks 606 and 610 or after block 612, the computing device decrements the current offset in RT_LIST [P] to account for the deleted array element from array 200. Because an element has been removed to the array 200 and incorporated into the offsets in array 250, any subsequent offsets in array 250 should also be decremented. Accordingly, at decision block 616, a test is conducted to determine whether P is less than the RT_LIST SIZE. If P is less than RT_LIST SIZE, at block 618, P is incremented and the routine 600 returns to block 614 to decrement the offset in RT_LIST. The routine 600 will repeat this step until the end of the array 250 is reached and routine 600 ends at block 620.

Figure 7A:
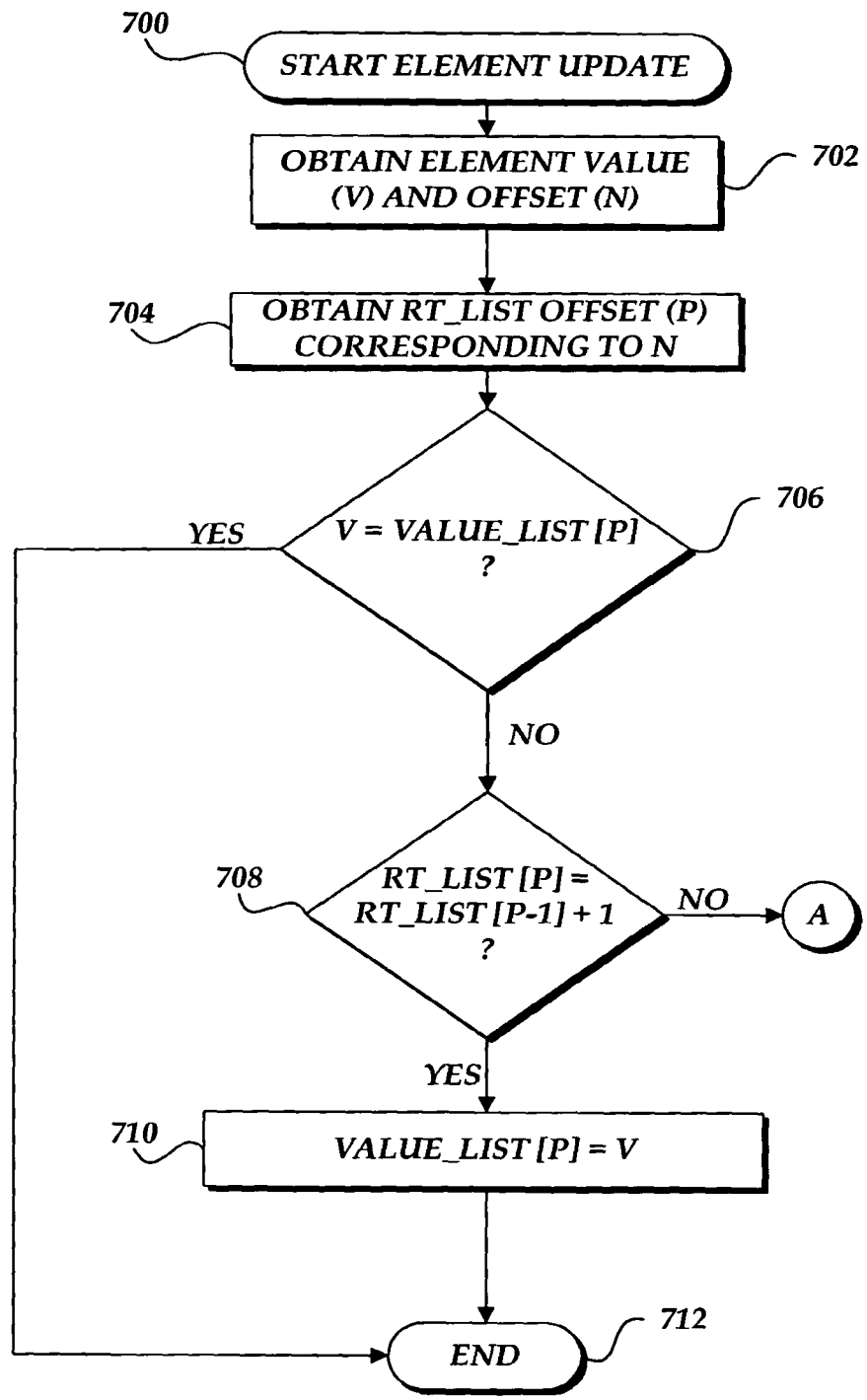
FIGS. 7A and 7B are flow diagrams illustrative of an array update routine implemented by a computing device in accordance with an aspect of the present invention.
Figure 7B:
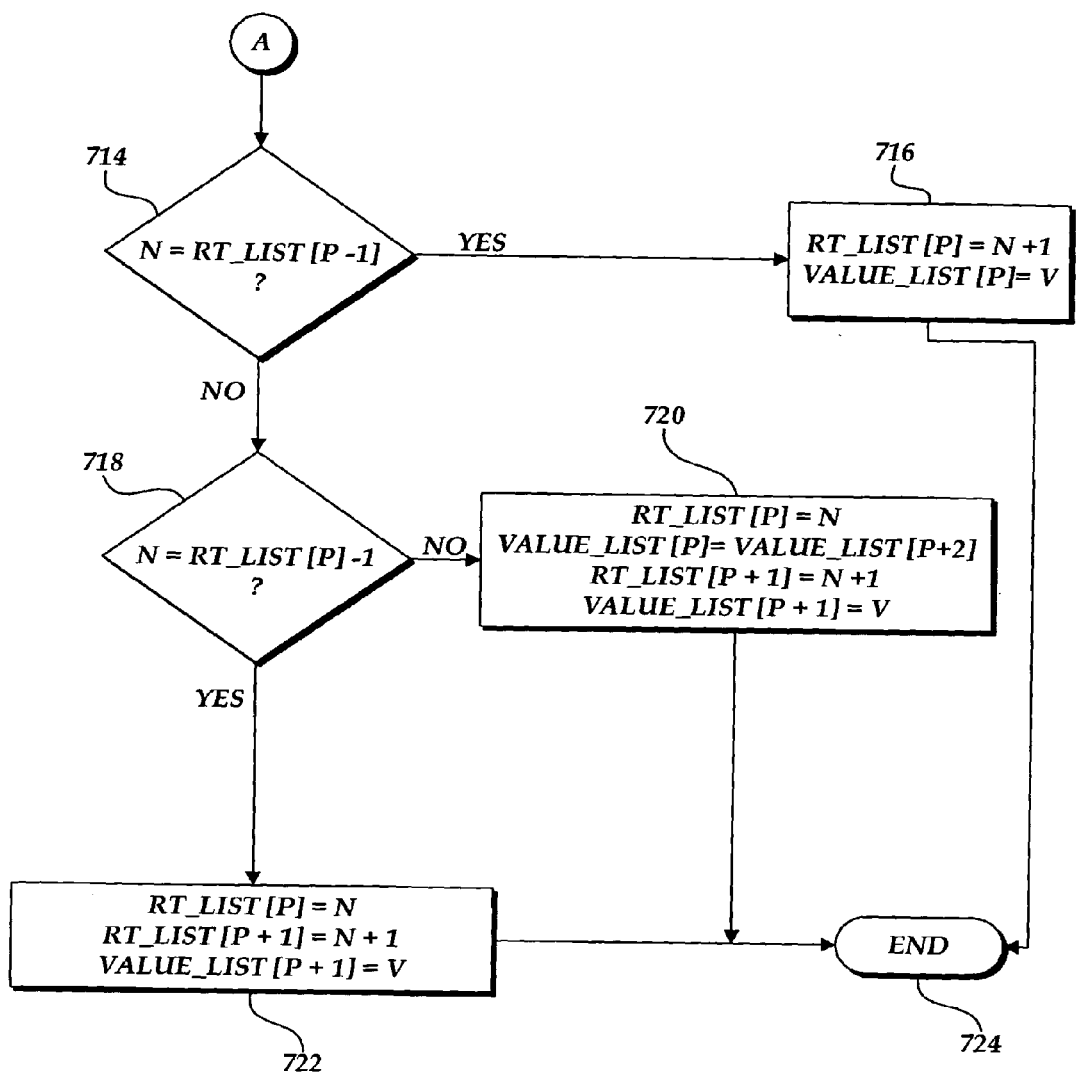

With reference now to FIGS. 7A and 7B, flow diagrams illustrative of an array update routine 700 implemented by a computing device in accordance with an aspect of the present invention will be described. Routine 700 can be implemented by a computing system that has generated, or otherwise obtained, an array 250 and is utilized to update an element in the data array 250 without requiring a regeneration of the original data array 200 and reprocessing.

At block 702, the computing system obtains an element value, "V", to be modified and a positional offset, "N", where to insert the element value in original array 200. At block 704, the computing device obtains the positional offset of the array 250, "P", corresponding to N. In an illustrative embodiment of the present invention, routine 400 may be utilized to return the positional offset P. At decision block 706, a test is conducted to determine whether the value of the element to be inserted is the same of the current value in the sequence, VALUE_LIST [P]. If so, the array element does not need to be updated and the routine 700 terminates at block 712.

If the value of the element is not the same as the current element, at decision block 708, a test is conducted to determine whether the identified array element N is a single array element that is not part of any sequence of array elements in array 250. In an illustrative embodiment, the computing system determines whether RT_LIST [P] is equal to the RT_LIST [P−1]+1. If the identified array element is not part of a single array element, the routine 700 proceeds to block 714 (FIG. 7B). Alternatively, if the identified array element is part of a single array element, the array element value, VALUE_LIST [P] is set to V at block 710. The routine 700 terminates at block 712.

Turning now to FIG. 7B, if the array element to be updated is not part of a single array element, at decision block 714, a test is conducted to determine whether the identified element corresponding to offset N is the first array element in the sequence of element. In an illustrative embodiment, the computing system determines whether N=RT_LIST [P−1]. If so, then the computing device inserts an extra array element to array 250 at P at block 716. Additionally, the offset and value of the new array element are RT_LIST [P]=N+1 and VALUE_LIST [P]=V. At block 724, the routine 700 ends.

If the identified element corresponding to offset N is the first element in the array, at decision block 718, a test is conducted to determine whether N is equal to the positional offset found in column 252 at the previous pointer value, e.g., RT_LIST [P−1]. If N is not equal to the positional offset found in column 252 at the previous pointer value than the array element is in the middle of a previous sequence. Accordingly, at block 720 two extra array elements are added to array 205 at P and P+1. Additionally, the offset and value of the new array elements are RT_LIST [P]=N, VALUE_LIST [P]=VALUE_LIST [P+2], RT_LIST [P+1]=N+1 and VALUE_LIST [P+1]=V. At block 724, the routine 700 ends.

Alternatively, if N is equal to the positional offset found in column 252 at the previous pointer value than the array element is at the end of a previous sequence. Accordingly, at block 722 an extra array element is added to array 250 at P. Additionally, the offset and value of the new array element are RT_LIST [P]=N+1 and VALUE_LIST [P]=V. Moreover, the value of RT_LIST [P] is =N. At block 724, the routine 700 ends.

While illustrative embodiments of the invention have been illustrated and described, it will be appreciated that various changes can be made therein without departing from the spirit and scope of the invention.

The embodiments of the invention in which an exclusive property or privilege is claim are defined as follows:

1. A method for processing data, the method comprising:
   obtaining a set of data defined by an offset and a value in an original sequence, wherein the set of data includes a plurality of subsets of data corresponding to a sequential repeating values;
   generating an entry in a value array corresponding a value of a first data element in the set of data;
   determining whether any sequential data elements in the set of data have the same value as the first data element;
   for an identified subset of sequential repeating values, generating an entry in an offset array corresponding to an offset of a last sequential data element having the same value as the first data element, wherein the offset of the last sequential data element corresponds to an offset in the original sequence determined from a starting point defined by a first element in the offset array; and
   repeating for each additional data element in the set of data.

2. The method as recited in claim 1, wherein generating an entry in an offset array corresponding to an offset of a last sequential data element having the same value as the first data element includes generating an entry in the offset array that is an offset of the next array element in the offset array.

3. The method as recited in claim 1 further comprising:
   obtaining a request to manipulate an array element in the set of array;
   processing the request by manipulating the value array or offset array without regenerating the set of data.

4. The method as recited in claim 3, wherein the request to manipulate an array element in the set of array corresponds to an insertion of a data array element.

5. The method as recited in claim 3, wherein the request to manipulate an array element in the set of array corresponds to a deletion of a data array element.

6. The method as recited in claim 3, wherein the request to manipulate an array element in the set of array corresponds to a modification of a data array element value.

7. The method as recited in claim 1 further comprising:
   obtaining a request to identify an array element according to a positional offset in the set of data;
   performing a binary search of the offset array to identify an entry corresponding to the positioned offset; and
   returning information corresponding to the binary search.

8. The method as recited in claim 7, wherein returning information corresponding to the binary search includes returning an array element value.

9. The method as recited in claim 7, wherein returning information corresponding to the binary search includes returning an offset array pointer value.

10. A method for processing an array of data defined by an offset and a value, the method comprising:
    obtaining a value array including a set of values for one or more sequences of array elements in the array of data wherein the value array includes a plurality of array elements corresponding to a sequential repeating values;
    obtaining an offset array corresponding to an offset of a last sequential data element corresponding to the one or more sequences of array elements, wherein the offset of the last sequential data element is defined from a starting point defined by a first element in the offset array;
    obtaining a request to identify information associated with an array element, wherein the array element is defined by a positional offset in the array of data;
    performing a binary search of the offset array to identify an entry corresponding to the positional offset in the array of data, wherein the binary search corresponds to identifying an associated offset value in the offset array; and returning information corresponding to a value associated with the associate offset value in the offset array.

11. The method as recited in claim 10, wherein returning information corresponding to the binary search includes returning an array element value.

12. The method as recited in claim 10, wherein returning information corresponding to the binary search includes returning an offset array pointer value.

13. The method as recited in claim 10, wherein obtaining a value array including a set of values for one or more sequences of array elements in the array of data and wherein obtaining an offset array corresponding to an offset of a last sequential data element corresponding to the one or more sequences of array elements include:
   generating an entry in a value array corresponding a value of a first data element in the set of data;
   determining whether any sequential data elements in the set of data have the same value as the first data element;
   generating an entry in an offset array corresponding to an offset of a last sequential data element having the same value as the first data element; and
   repeating for each additional data element in the set of data.

14. The method as recited in claim 10 further comprising:
   obtaining a request to manipulate an array element in the set of array;
   processing the request by manipulating the value array or offset array without regenerating the set of data.

15. The method as recited in claim 14, wherein the request to manipulate an array element in the set of array corresponds to an insertion of a data array element.

16. The method as recited in claim 14, wherein the request to manipulate an array element in the set of array corresponds to a deletion of a data array element.

17. The method as recited in claim 14, wherein the request to manipulate an array element in the set of array corresponds to a modification of a data array element value.

18. A system for processing a set of data defined by an offset and a value, the system comprising:
   a computing device, having instructions for execution, the instructions causing the computing device to:
      obtain a value array including a set of values for one or more repeating sequences of array elements in the array of data;
      obtain an offset array corresponding to an offset of a last sequential data element corresponding to the one or more sequences of array elements, wherein the offset of the last sequential data element corresponds to an offset of a respective array element in an original sequence of data determined from a starting point defined by a first element in the offset array; and
      process the value array and offset array without requiring a regeneration of the set of data responsive to a request to identify a value associated with a specified offset in the value array, wherein processing the value array and the offset array includes identifying an associated offset value in the offset array associated with the specified offset and returning a value associated with the associated offset value.

* * * * *